United States Patent [19]

Asada

[11] Patent Number: 5,111,060
[45] Date of Patent: May 5, 1992

[54] ELECTRONIC CIRCUIT EQUIPPED WITH REDUNDANT OR SPARE CIRCUIT ELEMENTS FOR EVERY CIRCUIT ELEMENT

[75] Inventor: Hideki Asada, Tokyo, Japan
[73] Assignee: NEC Corporation, Tokyo, Japan
[21] Appl. No.: 582,633
[22] Filed: Sep. 13, 1990
[30] Foreign Application Priority Data
Sep. 13, 1989 [JP] Japan .................. 1-238611
[51] Int. Cl.⁵ .............. H03K 19/12; H03K 17/16
[52] U.S. Cl. .................... 307/219; 307/443; 307/451; 307/202.1
[58] Field of Search ............ 307/443, 448, 451, 202.1, 307/219

[56] References Cited
U.S. PATENT DOCUMENTS
4,689,494  8/1987  Chen et al. ................ 307/219
4,937,475  6/1990  Rhodes et al. ............. 307/202.1

FOREIGN PATENT DOCUMENTS
0429536  5/1974  U.S.S.R. ........................ 307/219

OTHER PUBLICATIONS
Y. Matsueda, et al., "Defect-Free Active Matrix LCD with Redundant Poly-Si TFT Circuit," SID 89 Digest, pp. 238-241 (1989).

Primary Examiner—Stanley D. Miller
Assistant Examiner—Margaret Rose Wambach
Attorney, Agent, or Firm—Helfgott & Karas

[57] ABSTRACT

The redundant system in accordance with the present invention has, in the shift register, one-dimensional switching array, buffer circuit or the like for the peripheral circuits of a liquid crystal display, spare shift registers, switches, buffers or the like for every bit, switch, buffer or the like, and an improvement of the yield is realized by replacing defective circuits by the spare circuits by means of laser beams or the like.

10 Claims, 11 Drawing Sheets

ELECTRONIC CIRCUIT EQUIPPED WITH REDUNDANT OR SPARE CIRCUIT ELEMENTS FOR EVERY CIRCUIT ELEMENT

BACKGROUND OF THE INVENTION

1. Field of the Invention

The present invention relates to redundant systems, and more particularly to redundant systems in the peripheral circuit to be used for liquid crystal displays, contact type image sensors, liquid crystal optical shutters and the like.

2. Description of the Related Art

For the purposes of reducing the size and cost as well as increasing the reliability of the product, there is known a technique in which thin film driver circuits are manufactured integrally with a liquid crystal display, a contact type image sensor, a liquid crystal optical shutter or the like. This technique is introduced based on the concept that it should be possible to drastically cut back the number of connection terminals and the number of external driver integrated circuits, and to resolve the problem of reliability that is generated due to the bonding process of large area and high density, by the installation of peripheral driver circuits on the same substrate as that of the pixel electrodes.

A shift register constitutes an important element of the thin film peripheral driver circuit as a serial-parallel converter. FIG. 1 is a diagram showing the conventional N-stage thin film shift register 103. Shift register stages 101 are able by means of a two-or four-phase clock to sequentially transfer a signal input to an input terminal 104 with a predetermined frequency from the first stage output to the N-th stage output, and are utilized as scanning circuits or a serial-parallel converter for picture signals.

Further, one-dimensional switching arrays are used, for example, at the time of employing a block driving system which is effective for apparently increasing the writing speed of picture signals.

FIG. 2 is a diagram showing the conventional one-dimensional switching array. The gate electrodes of switching transistors 301, of which each constitutes the switching array within one block, are connected to a common switching control line 303, and independent picture signals can be transferred, according to a block pulse input to the switching control line 303, from the drain side to the source side of the transistors 301 by means of the same timing switch.

FIG. 3 is a diagram showing a conventional example of the buffer circuit which serves as the interface between a shift register or a decoder and a part to be driven. A buffer 501 is a circuit which is required for driving a high capacitive load of the order of 100 pF.

The aforementioned peripheral driver circuit is ordinarily formed not by integrating amorphous silicon (referred to as a-Si hereinafter) thin film transistors but by polycrystalline silicon (referred to as poly-Si hereinafter) thin-film transistors. The reason for doing so is that the mobility of a poly-Si thin film transistor is larger by about two orders of magnitude than that of an a-Si thin film transistor permitting to expect peripheral driver circuits for higher driving frequencies, so that it become possible to deal with liquid crystal displays, contact type image sensors, liquid crystal optical shutters or the like with larger area and higher resolution.

With the increase in the dimension and the area of liquid crystal displays, contact type image sensors, liquid crystal optical shutters and the like, it is very difficult under the currently available processing technology to form defect-free thin film driver circuits. A defect in the shift register appears, for example, as a plane defect in a two-dimensional image of the liquid crystal display and the like. Further, a defect in a switching array or a buffer circuit appears as a line defect. Since these defects can occur even when the pixel array part is free from the defects, a poor yield of the peripheral driver circuits is becoming a substantial factor for deteriorating the yield for system as a whole of liquid crystal displays, contact type image sensors, liquid crystal optical shutters and the like.

In order to resolve such a problem, a configuration is disclosed in which a 480-bit regular shift register, for example, is made into one block and another 480-bit shift register is redundantly as its spare, in Y. Matsueda et al., "Defect-Free Active-Matrix LCD with Redundant Poly-Si TFT Circuit", SID 89 Digest, pp. 238–241 (1989). However, with the above-mentioned shift register configuration having the 480-bit shift registers that form the regular and the spare blocks the yield was hardly improved.

SUMMARY OF THE INVENTION

Therefore, it is an object of the present invention to provide redundant systems, which can improve the yield of the electronic circuits especially the peripheral driver circuits used for the liquid crystal displays or the like.

In accordance with the present invention, it is possible to obtain an electronic circuit with a redundant system having a plurality of first signal processing means with an identical function, a plurality of input signal terminals for supplying input signals to input terminals of the first signal processing means, respectively, a plurality of output signal terminals for respectively outputting output signals from output terminals of the first signal processing means, a plurality of output signal lines respectively connected to the output signal terminals, one or more second signal processing means respectively arranged in the vicinities of the respective first signal processing means, the second signal processing means having a function identical to that of the first signal processing means, input terminal connection means for connecting the respective input signal terminals to the input terminals of the respective signal processing means, each selected from the respective first signal processing means and one or more of the second signal processing means arranged in the respective vicinities of the first signal processing means, and output terminal connection means for respectively connecting the selected signal processing means to the respective output signal terminals.

The present invention is constituted so as to have one or more of the second signal processing means per first signal processing means If K units of the second signal processing means per first signal processing means are installed, then it is possible to construct a circuit which will operate perfectly even when K units out of the total of (K+1) units of signal processing means develop defects, so that the yield of the peripheral driving circuits can be improved markedly.

To be more specific, in the application of the present invention, for example, to the case of the 480-bit regular shift register mentioned above, there will be obtained a construction in which one or more of the spare shift register stages are provided for each bit where the defective bits are replaced by wiring corrections. Then, in the shift register according to the present invention, the circuit will operate properly unless defects are simultaneously developed in two or more than two shift registers on the same bit.

The probability for two or more shift register stages on the same bit becoming defective simultaneously is extremely small, compared with the probability for both of the two 480-bit shift registers becoming simultaneously defective bits.

Accordingly, application of the shift register of the present invention to the peripheral driver circuits for the picture input and output device will improve the yield markedly and realize a reduction in the costs.

It should be noted that the replacement of a defective circuit by a spare circuit element is carried out by irradiating the predetermined trimming spots with energy beams such as laser beams, ion beams, and electron beams, to disconnect and weld the wirings.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

First Embodiment

Figure 1:
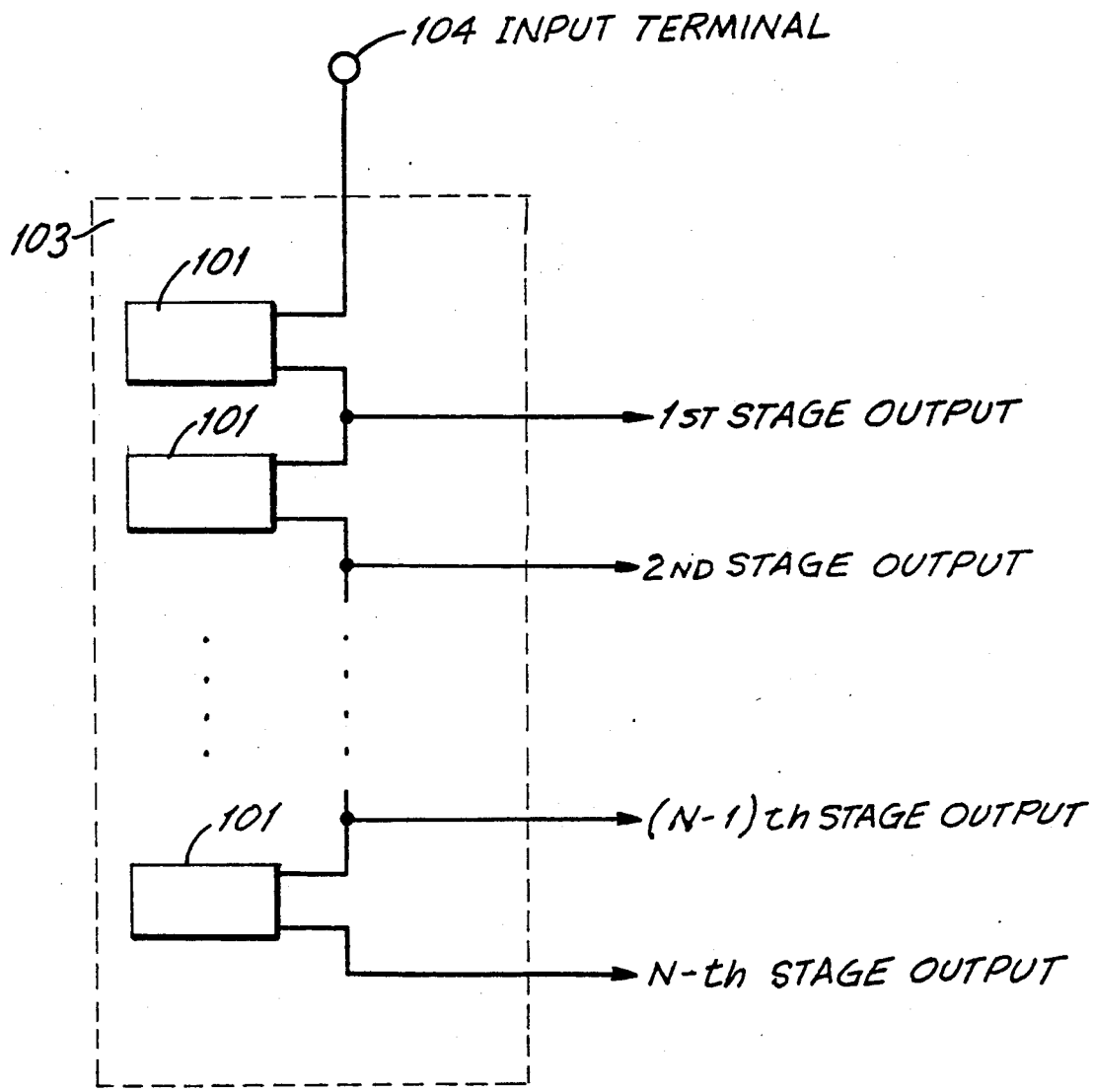
FIG. 1 is a circuit diagram of the conventional N-stage thin film shift register.
Figure 2:
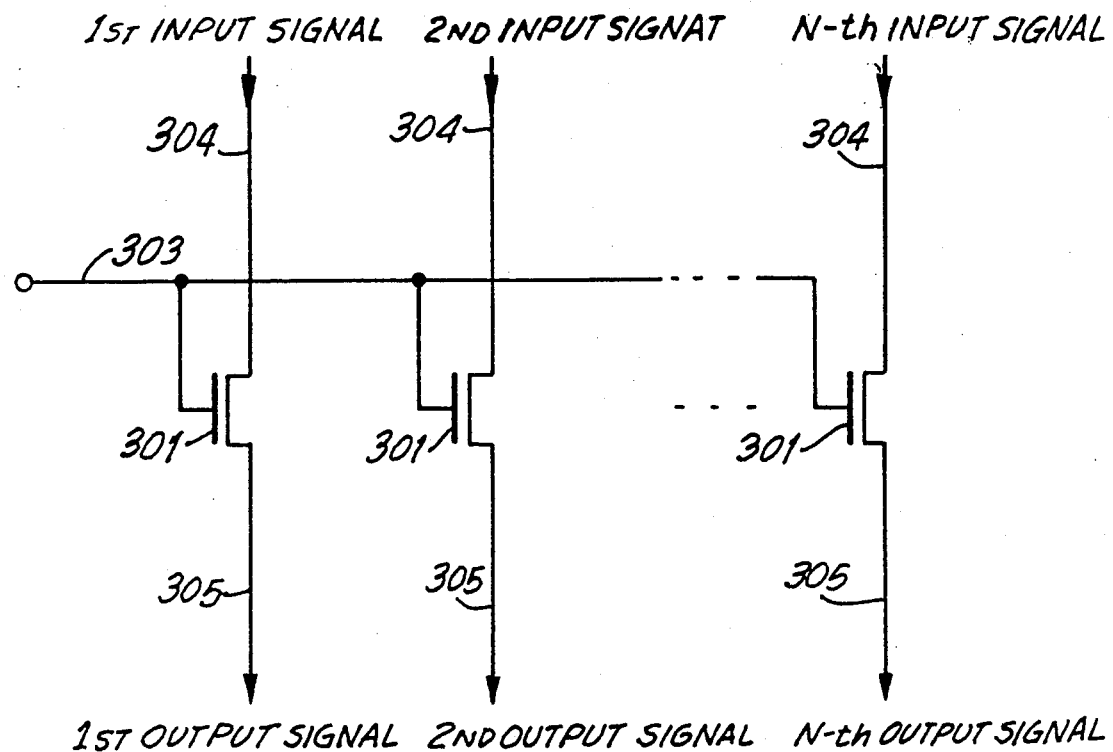
FIG. 2 is a circuit diagram of the conventional one-dimensional switching array.
Figure 3:
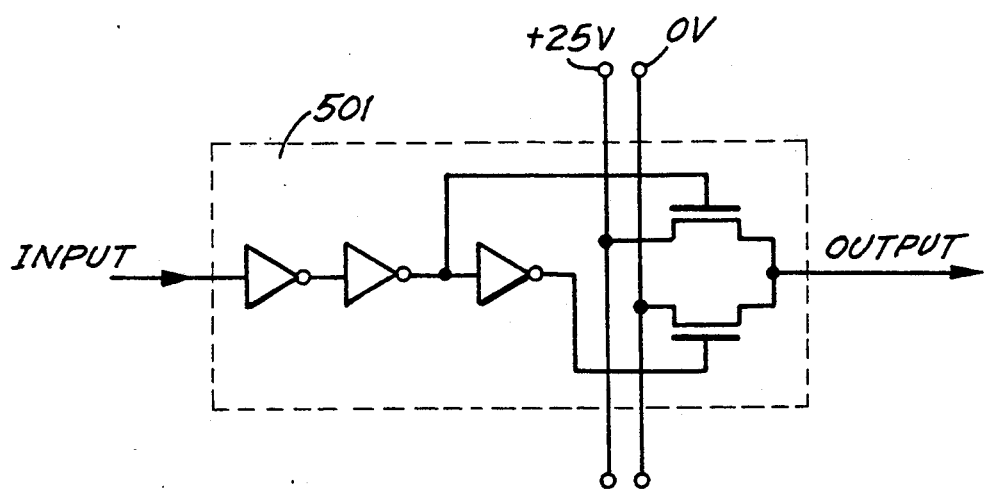
FIG. 3 is a circuit diagram of the conventional buffer circuit.
Figure 4:
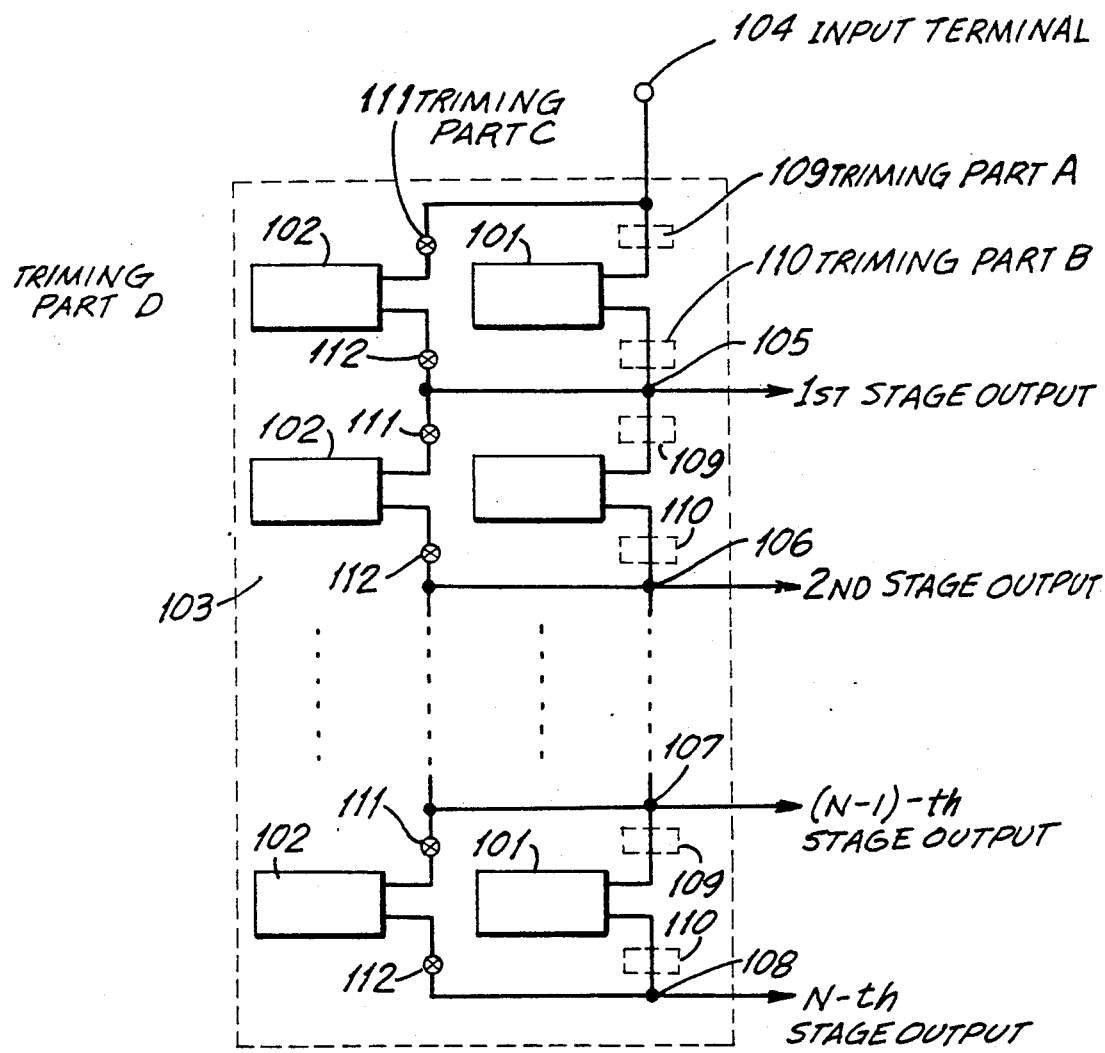
FIG. 4 is a circuit diagram of a first embodiment of the present invention.

Referring to FIG. 4, the N-stage shift register 103 has a configuration in which a spare shift register stage 102 per stage is provided in addition to a regular shift register 101. In the figure, some intermediate stages are omitted, but each of these stages has a configuration identical to that of the first or the second stage. Further, the clock terminals for the shift registers 101 are also omitted.

The shift register stages 101 are electrically connected to the input terminal 104 or the output terminals 105 to 108. On the hand, the spare shift register stages 102 are not electrically connected to the input terminal 104 or the output terminals 105 to 108.

In the present embodiment, flip-flops using NMOS FET's are employed as the shift register stages 101 and the spare shift register stages 102. Further, it is naturally possible to use any types of shift resistors such as the two-phase ratioed or ratioless shift register, the four-phase ratioed or ratioless shift register, and CMOS shift register.

In the present embodiment, as the means of disconnecting or welding the wirings for replacing a shift register stage 101 by a spare shift register stage 102, a method of irradiating predetermined trimming parts with a YAG laser (wavelength of 1.06 $\mu$m) is employed.

The predetermined parts in the above means a trimming part A109 and a trimming part B110 for disconnecting the wiring to electrically isolate shift register 101 from the circuit, and a trimming part C111 and a trimming part D112 for welding the wirings to connect spare shift register 102 to the circuit.

Figure 5A:
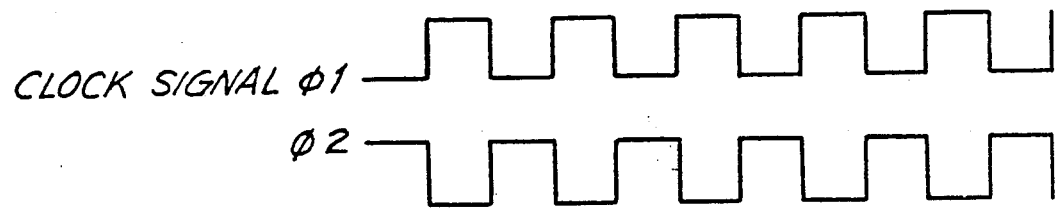
FIG. 5(a) to FIG. 5(c) are diagrams showing the output signals for describing the first embodiment of the present invention.

FIG. 5 (a) to (c) are diagrams showing the output signals of the (J−1)-th through the (J+1)-th stages before and after the trimming when there exists a defect in the J-th shift register 101 in the N-stage shift register 103 of the present embodiment.

Figure 5B:
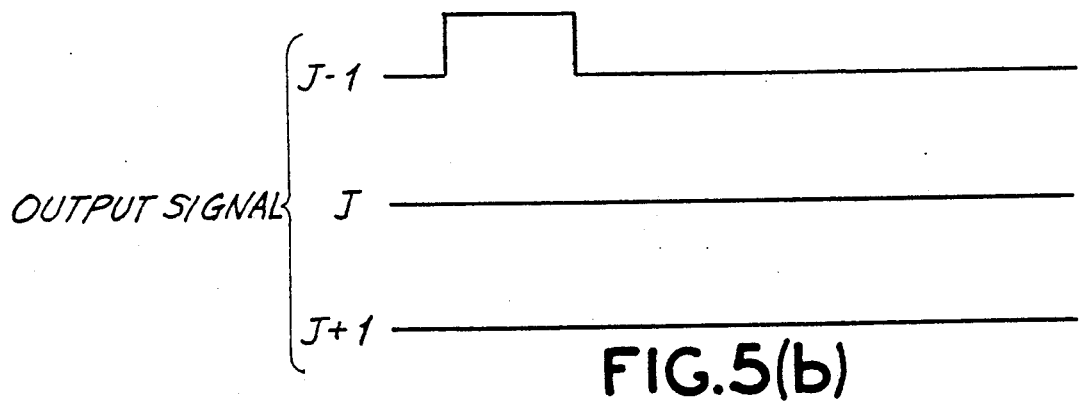
Figure 5C:
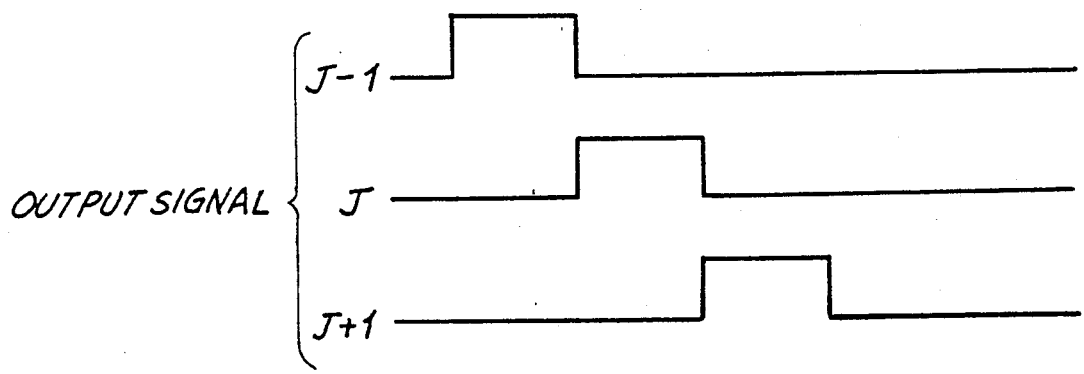

Prior to the trimming, the signal is not transferred to the J-th and the ensuing stages as shown in FIG. 5(b), and the outcome is detected, for example, in a liquid crystal display as a plane defect. In contrast to this, by replacing the J-th stage shift register 101 by the J-th stage spare shift register stage 102 by disconnecting and welding the wirings through irradiation of the four trimming parts A to D 109, 110, 111 and 112 with a YAG laser, the signal is transferred to the J-th and the ensuing stages as shown in FIG. 5(c), and it is possible to remedy the plane defect in the display.

Second Embodiment

Figure 6:
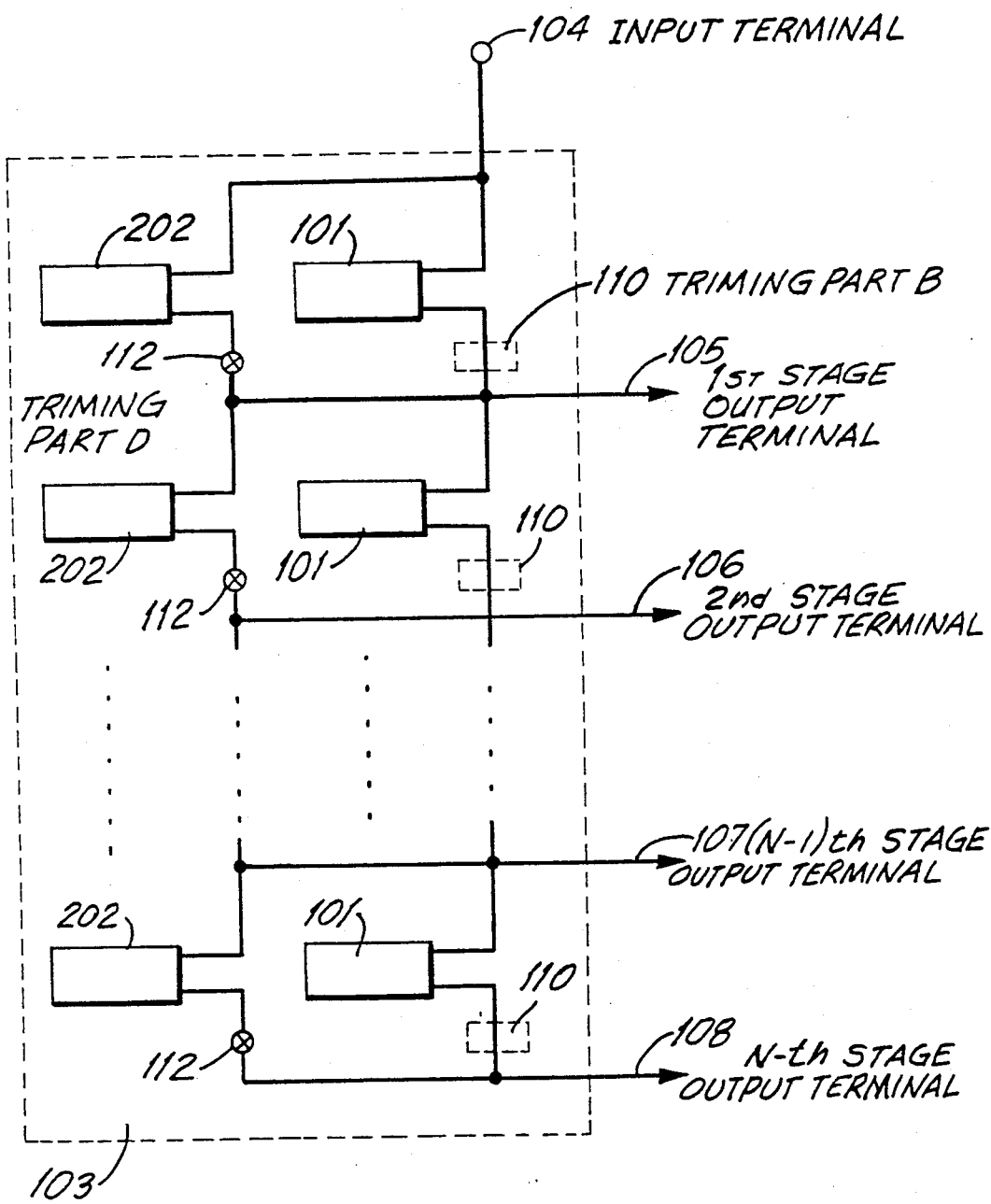
FIG. 6 and FIG. 7 are circuit diagrams of a second embodiment of the present invention.
Figure 7:
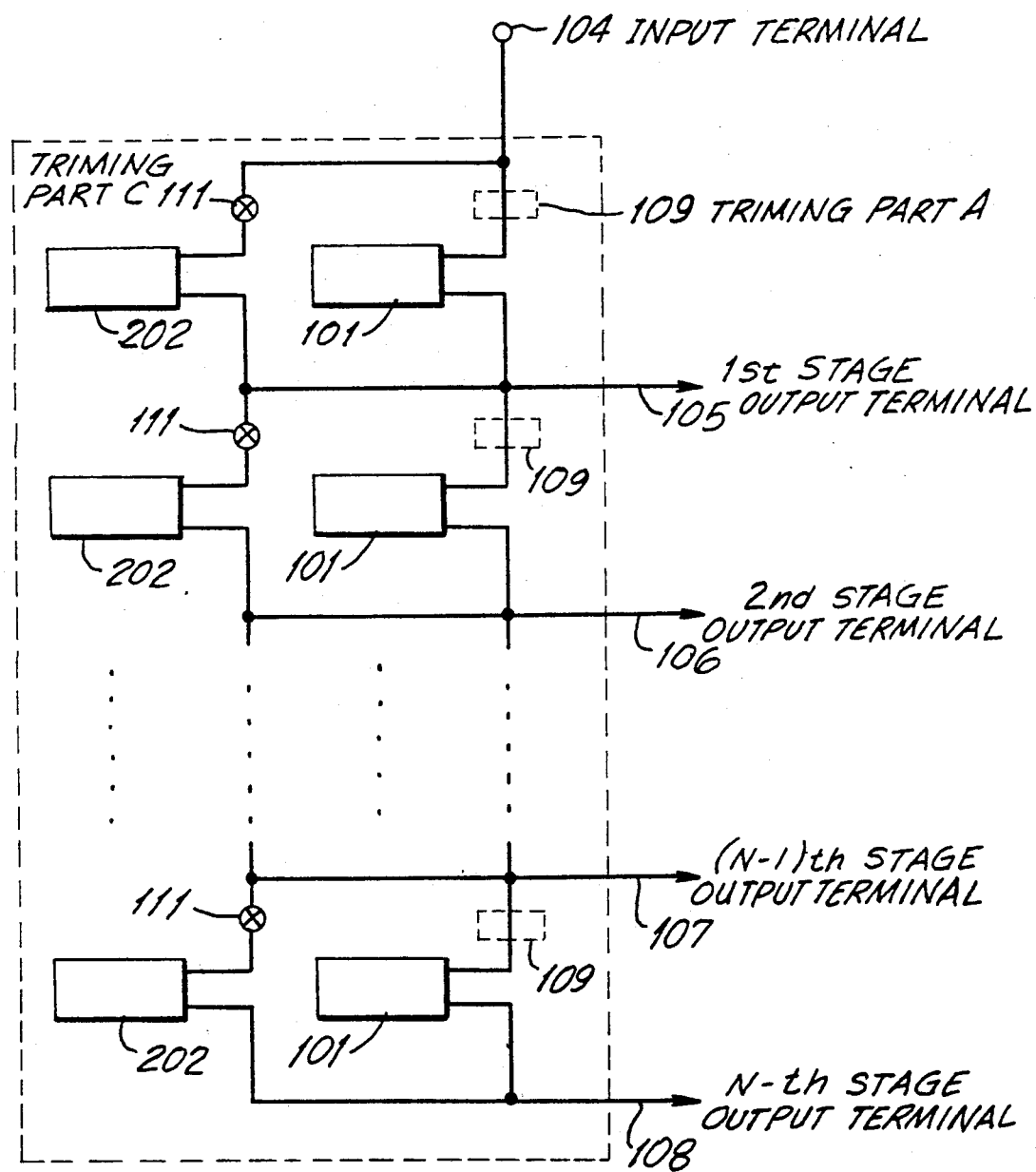

FIG. 6 and FIG. 7 are diagrams showing the second embodiment of the present invention. The difference of this embodiment from the first embodiment exists in that in contrast to the provision of the four trimming parts in the first embodiment for replacing a shift register stage 101 by a spare shift register stage 102, the trimming parts of the present embodiment is reduced to two.

In FIG. 6, there is shown a configuration in which the trimming part 109 and the trimming part C111 in FIG. 4 of the input side of the shift register stage 101 and the spare shift register stage 202 for the respective stages are deleted, and the replacement of the shift register stage 101 by the spare shift register stage 202 is carried out by the irradiation of the two trimming part B110 and the trimming part D112 on the output side with a YAG laser.

In order to satisfactorily carry out the above-mentioned replacement in the present embodiment, it is necessary that the input sides of the shift register stage 101 and the spare shift register stage 202 are in the open-circuit condition. Provided that this condition is satisfied the defect can be remedied in the same way as in the first embodiment.

In FIG. 7, there is shown a configuration in which the trimming part B110 and the trimming part D112 in FIG. 4 on the output sides of the shift register stage 101 and the spare shift register stage 202 for the respective stages are deleted, and the replacement of the shift register stage 101 by the spare shift register stage 202 is carried out by the irradiation of the two trimming part A109 and the trimming part C111 on the input side with a YAG laser.

In order to satisfactorily carry out the above-mentioned replacement of the present embodiment, it is necessary to have the output sides of the shift register stage 101 and the spare shift register stage 202 in the open-circuit condition.

Third Embodiment

Figure 8:
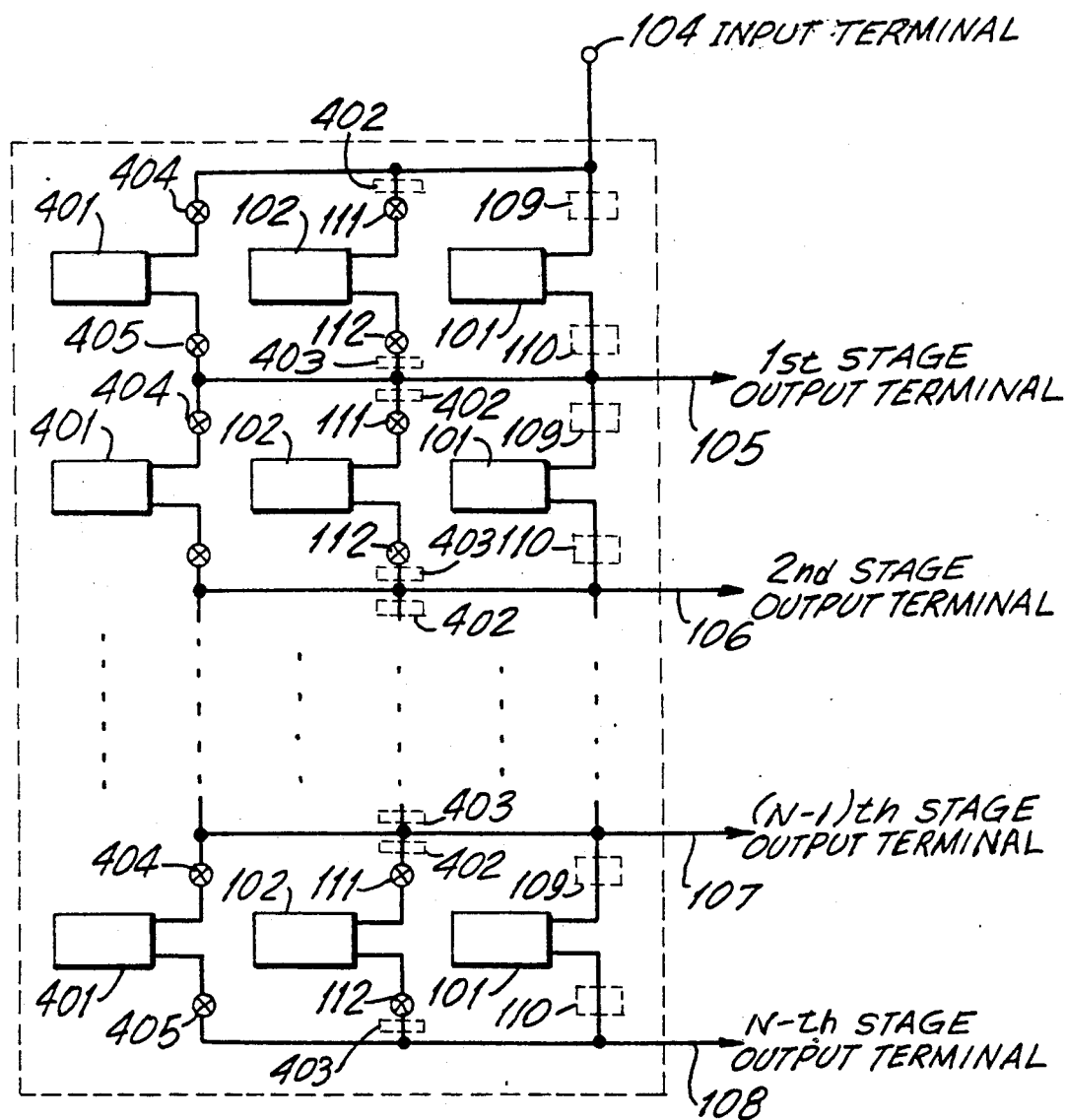
FIG. 8 is a circuit diagram of a third embodiment of the present invention.

FIG. 8 is a diagram showing the third embodiment of the present invention. The present embodiment differs from the first and the second embodiments in that two units of the spare shift register stages are provided for each stage, namely, there are installed one spare shift register stage 102 and one spare shift register B401 for each stage 101.

In the present embodiment, the trimming method for replacing the shift register stage 101 by the spare shift register stage 102 or a spare shift register stage 401 is entirely the same as in the first embodiment with four trimming parts per stage.

An advantage of the present embodiment is that even if defects exist in two shift registers among the three of the regular shift register stage 101, the first spare shift register stage 102 and the second spare shift register stage 401 that are provided for each stage, and it is possible to remedy the defects.

The defect remedy process for the case when there exist a defect in both of the shift register stage 101 of the J-th stage and the spare shift register stage 102 of the same J-th stage of the N-stage shift register of the present embodiment will be described in the following.

FIG. 9 (a) to (d) showing the output signals in the (J−1)-th stage through the (J+1)-th stage and the clock signals in the above-mentioned remedy process.

Figure 9A:
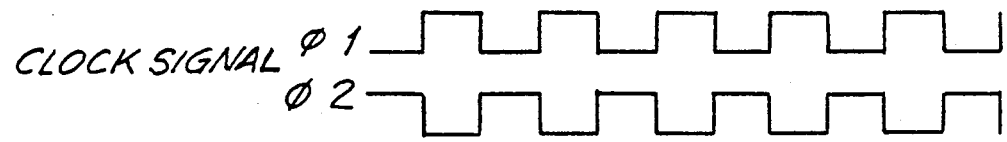
FIG. 9 is a diagram showing the output signal for describing the third embodiment of the present invention.
Figure 9B:
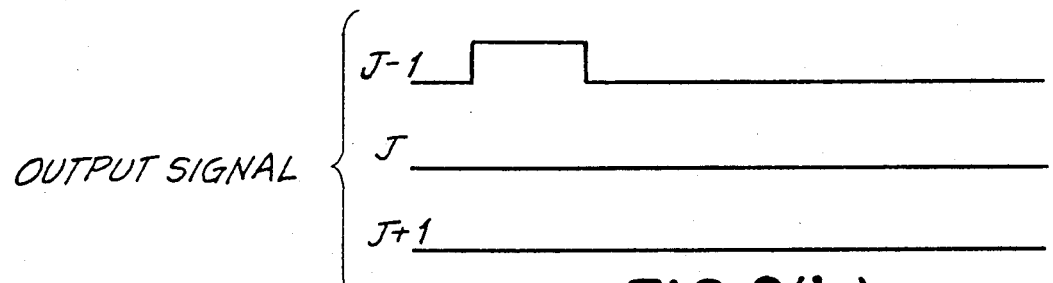

FIG. 9(a) shows the clock signals. FIG. 9(b) represents the output signals from the (J−1)-th stage through the (J+1)-th stage prior to the trimming, showing that the signal is not transferred to the J-th and the ensuing stages.

Figure 9C:
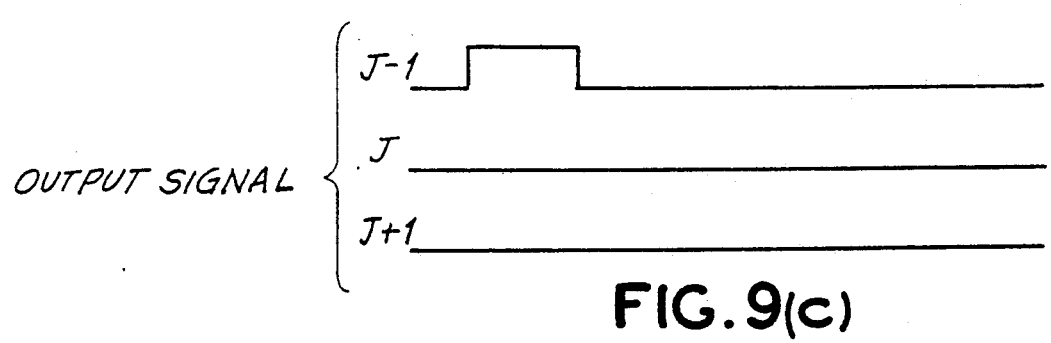

FIG. 9(c) represents the output signals of the (J−1)-th stage through the (J+1)-th stage after the replacement of the shift register 101 of the J-th by the spare shift register stage 102 of the same J-th stage through disconnection and welding by the irradiation of the four trimming parts A to D (109 to 112) with a YAG laser.

Figure 9D:
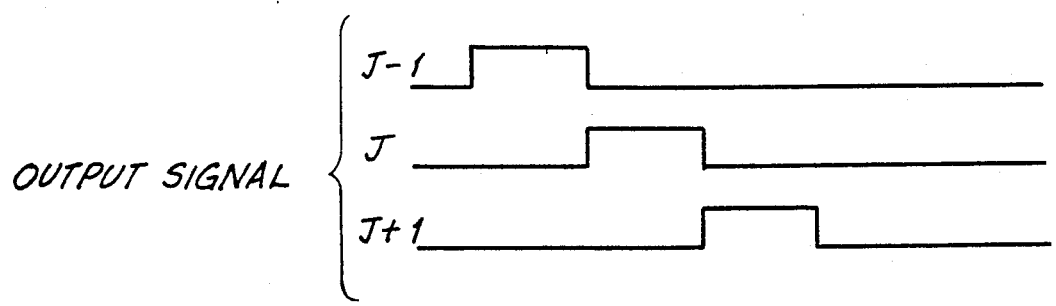

Since, however, there exists a defect also in the spare shift register stage 102, the signal is not transferred to and beyond the J-th stage. Nonetheless, it becomes possible in this embodiment to transfer the signal to the J-th and the ensuing stages as shown in FIG. 9(d) by disconnecting the spare shift register stage 102 by irradiating a trimming part E402 and a trimming part F403 with a YAG laser, and by connecting the spare shift register stage 401 by irradiating a trimming part G404 and a trimming part H405 with the YAG laser.

It should be noted that two or more units of the spare shift register stages may be installed although only one unit is provided in the present embodiment.

Fourth Embodiment

Figure 10:
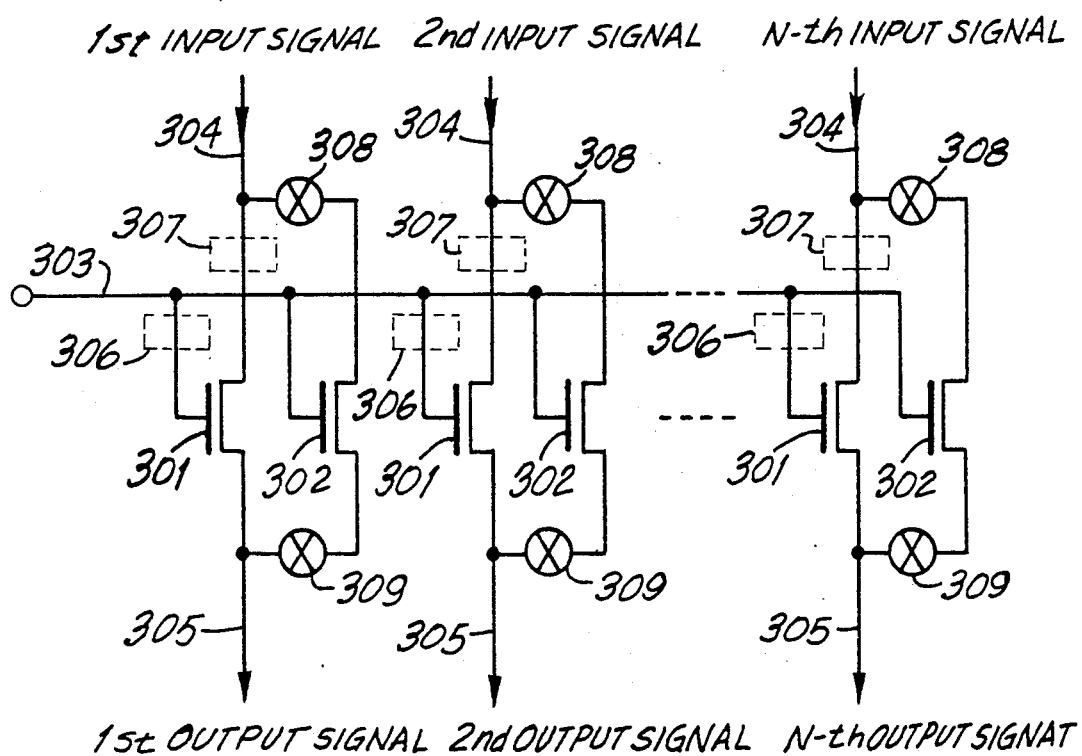
FIG. 10 is a circuit diagram of a fourth embodiment of the present invention.

FIG. 10 is a diagram showing the fourth embodiment of the peripheral driver circuit in accordance with the present invention.

In the one-dimensional switching array of the present embodiment one unit of spare switching transistor 302 is installed in addition to one switching transistor 301.

The gate electrode of a switching transistor 301 is connected to a switching control line 303 which is common to other thin film transistors, and its drain electrode and the source electrode are connected to an input signal line 304 and an output signal line 305, respectively, that are independent from those for other thin film transistors. Further, the gate electrode of the spare switching transistor 302 is connected the switching control line 303, but its drain electrode and the source electrode are isolated from the input signal line 304 and the output signal line 305, respectively.

When a defect develops in the switching transistor 301 of this circuit, the switching transistor 301 is electrically isolated from the switching control line 304 and the input signal line 304 by irradiating a wiring part 306 which connects the gate electrode of the switching transistor 301 and the switching control line 303, and a wiring part 307 which connects the drain electrode of the switching transistor 301 and the input signal line 304, with a YAG laser. On the other hand, the spare switching transistor 302 is electrically connected to the input signal line 304 and the output signal line 305 by irradiating a part 308 where the drain electrode of the spare switching transistor 302 meets a branch of the input signal line 304 that is extended in advance to a vicinity of the drain electrode of the transistor 302, and a part 309 where the source electrode of the spare switching transistor 302 meets a branch of the output signal line 305 that is extended in advance to a vicinity of the source electrode of the transistor, with the YAG laser. As a result, the input signal can pass through the spare switching transistor 302, and can be output as the correct output signal.

Figure 11:
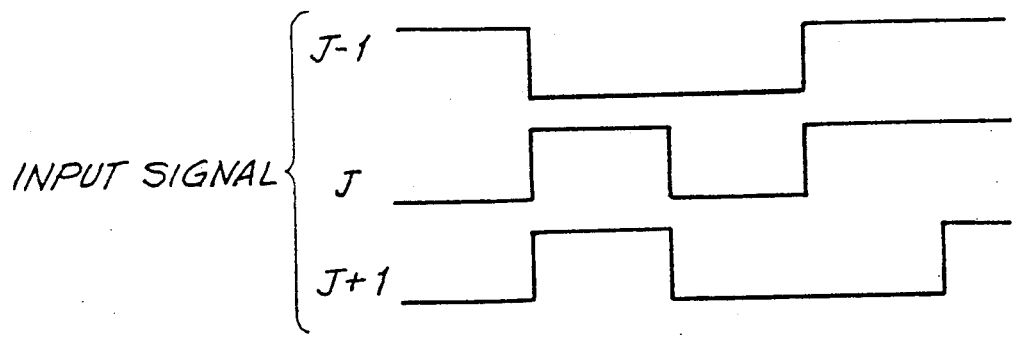
FIG. 11 is a diagram showing the output for describing the fourth embodiment of the present invention.
Figure 11A:
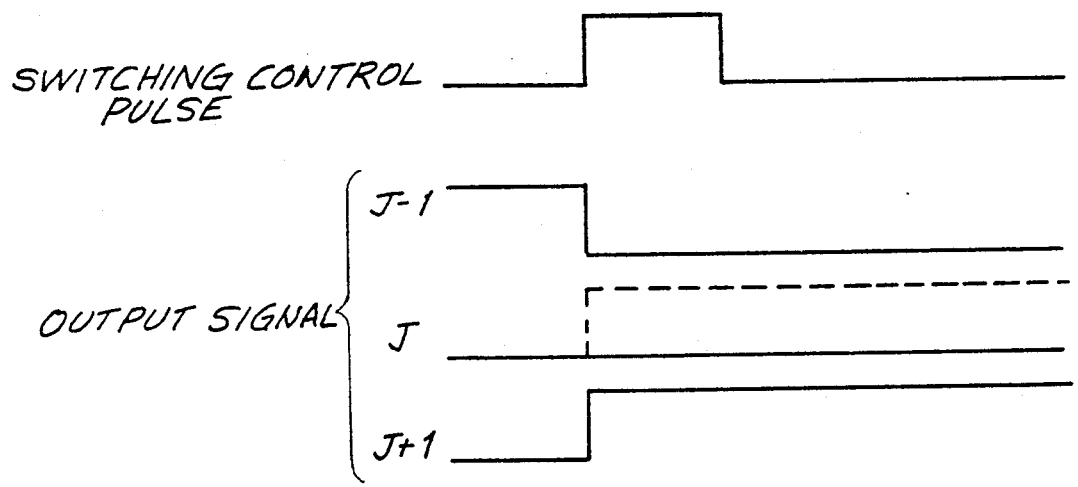

FIG. 11 is a diagram showing (J−1)-th through (J+1)-th output signals before and after remedy of a defect in J-th switching transistor in the switching array of the present embodiment. Prior to the laser trimming there cannot be obtained the correct output for the J-th output signal (broken line in FIG. 11(a)), which is detected in a liquid crystal display, for example, as a line defect.

Figure 11B:
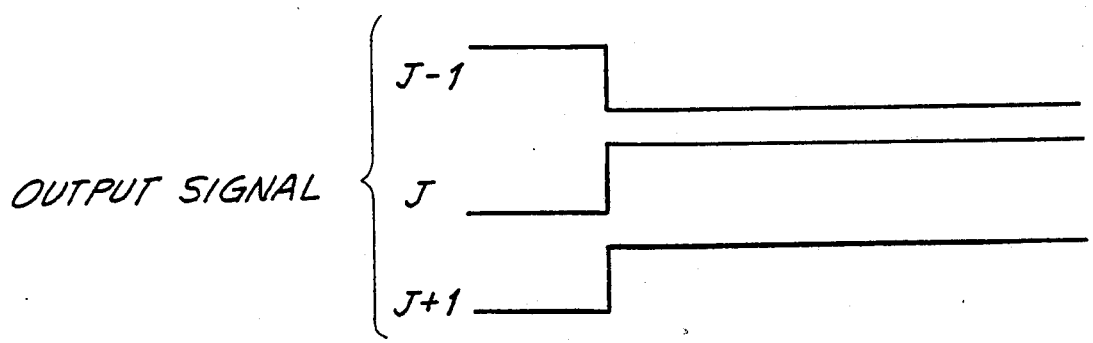

In contrast to the above, it is possible to obtain the correct output signal as shown in FIG. 11(b) by replacing the J-th switching transistor by the J-th spare switching transistor in accordance with the aforementioned method, whereby the line defect in the liquid crystal display generated by the defect in the switching transistor can be remedied.

In this embodiment, NMOS (N-channel MOS transistor) switching array is used. It is also possible, however, to use CMOS (complementary MOS transistor) switching array.

Fifth Embodiment

Figure 12:
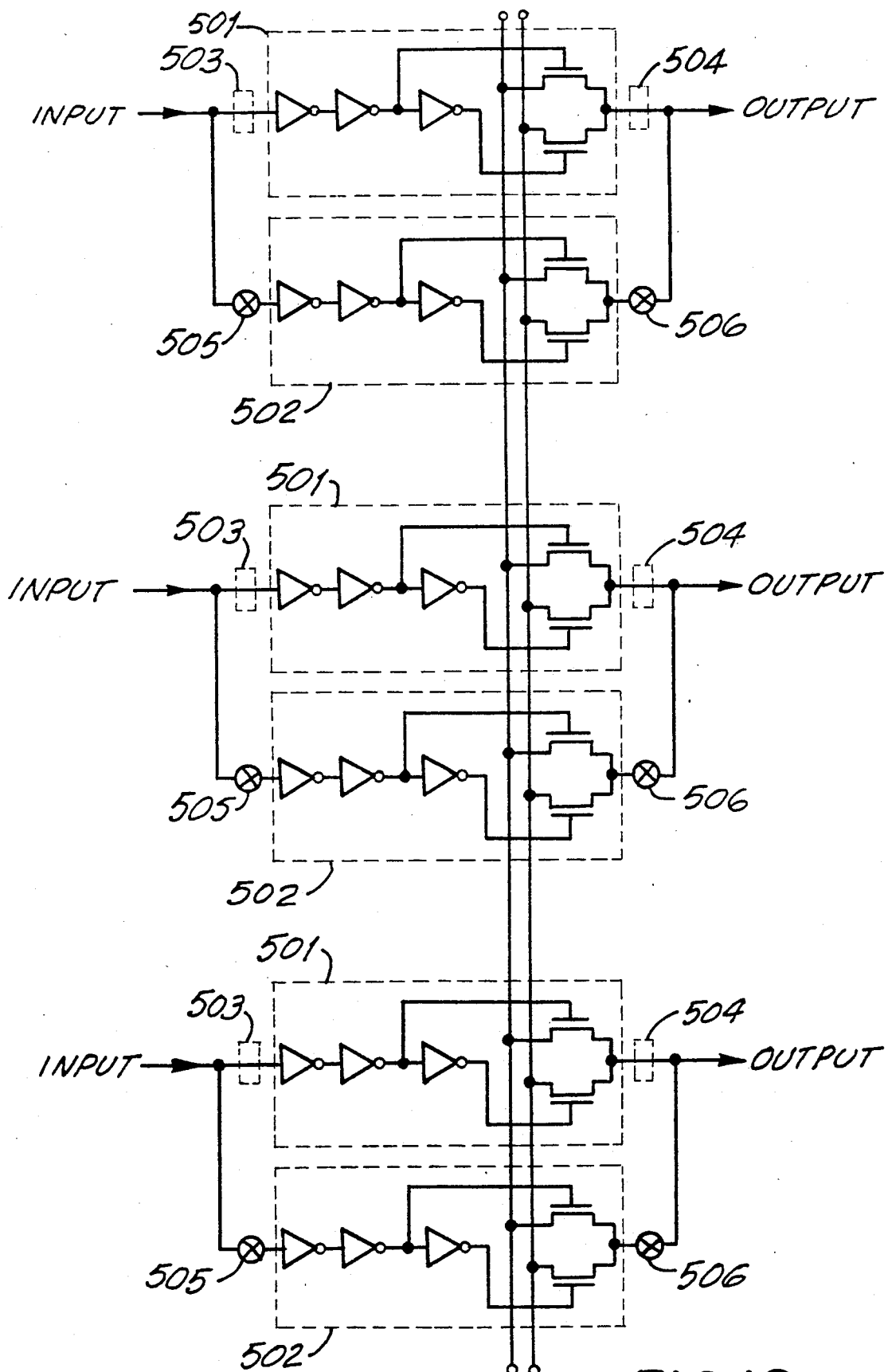
FIG. 12 is a circuit diagram of a fifth embodiment of the present invention.

FIG. 12 is a diagram showing an example of the application of the present invention to a buffer circuit.

In the present embodiment, one unit of spare buffer 502 is installed in addition to a buffer 501. The trimming method for replacing a buffer 501 by a spare buffer 502 is entirely analogous to that in the first embodiment which is carried out by disconnecting and then connecting the wirings through irradiation of the trimming parts A to D (503 to 506) with the YAG laser. In this embodiment, buffer circuits 501 and 502 consist of NMOS thin film transistors, but it is also possible to use CMOS buffer circuits. The result of an actual application of the present redundant system to the peripheral driven circuits of a liquid crystal display confirmed that it is possible to avoid the generation of the line defect.

What is claimed is:

1. An electronic circuit comprising:
   a plurality of first signal processing means having an identical function;
   a plurality of input signal terminals for supplying input signals to input terminals of said first signal processing means, respectively;
   a plurality of output signal terminals for respectively outputting output signals from output terminals of said first signal processing means;
   a plurality of second signal processing means having an identical function which is also identical to that of said first signal processing means;
   said second signal processing means being arranged in the circuit in groups with said first signal processing means so that each group includes one of said first signal processing means and at least one of said second processing means positioned in the vicinity of a respective first processing means;
   first input connecting lines each connecting an input terminal of a respective first signal processing means of each group to a respective input signal terminal;
   first output connecting lines each connecting an output of a respective first signal processing means of each group to a respective output signal terminal;
   at least one of said first input and output connecting lines including a first trimming element which breaks when irradiated by an energy beam so as to break an electrical connection between a respective first signal processing means and one of said respective input and output terminals;
   second input connecting lines each provided between an input terminal of a respective second signal processing means of each group and a respective input signal terminal;
   second output connecting lines each provided between an output terminal of a respective second signal processing means of each group and a respective output signal terminal;
   at least one of said second input and output connecting lines including a second trimming element which becomes activated only when irradiated by an energy beam, so as to establish an electrical connection between a respective second processing means and one of said respective input and output terminals, whereby when a defect occurs in any of said first signal processing means, a defective first signal processing means is replaced by the second signal processing means in the same group by irradiating said first trimming part and thereby disconnecting said defective first signal processing means from the circuit and irradiating said second trimming part and thereby connecting the second signal processing means of the same group with the circuit.

2. An electronic circuit as recited in claim 1, wherein said first signal processing means is a circuit element for forming a shift register.

3. An electronic circuit as recited in claim 1, wherein said first signal processing means is a switch within a one-dimensional switching array.

4. An electronic circuit as recited in claim 1, wherein said first signal processing means is a buffer circuit.

5. An electronic circuit as recited in claim 1, wherein said first and second signal processing means are constructed by incorporating transistors that have polycrystalline silicon as active layers.

6. An electronic circuit as recited in claim 1, wherein said energy beam is a laser beam.

7. An electronic circuit as recited in claim 1, wherein said energy beam is selected from the group consisting of laser beam, ion beam and electron beam.

8. An electronic circuit as recited in claim 1, wherein each of said first input and output connecting lines includes said first trimming element.

9. An electronic circuit as recited in claim 8, wherein each of said second input and output connecting lines includes said second trimming element.

10. An electronic circuit as recited in claim 1, wherein each of said second input and output connecting lines includes said second trimming element.

* * * * *